United States Patent
Hosokura et al.

(10) Patent No.: US 6,815,045 B2
(45) Date of Patent: Nov. 9, 2004

(54) METHOD FOR MANUFACTURING A METAL POWDER, A METAL POWDER, AN ELECTROCONDUCTIVE PASTE USING THE SAME, AND A MULTILAYER CERAMIC ELECTRONIC COMPONENT USING THE SAME

(75) Inventors: Tadasu Hosokura, Omihachiman (JP); Atsuyoshi Maeda, Otsu (JP)

(73) Assignee: Murata Manufacturing Co. Ltd (JP)

(*) Notice: Subject to any disclaimer, the term of this patent is extended or adjusted under 35 U.S.C. 154(b) by 0 days.

(21) Appl. No.: 10/231,102

(22) Filed: Aug. 30, 2002

(65) Prior Publication Data

US 2003/0044610 A1 Mar. 6, 2003

Related U.S. Application Data

(62) Division of application No. 09/841,199, filed on Apr. 24, 2001, now Pat. No. 6,503,291.

(30) Foreign Application Priority Data

Apr. 27, 2000 (JP) ........................................ 2000-128371

(51) Int. Cl.[7] .............................. H01G 4/30; B22F 9/22
(52) U.S. Cl. ........................ 428/209; 428/469; 428/403; 252/513; 252/521.1; 361/301.1; 361/301.4
(58) Field of Search ........................ 75/228, 236, 245, 75/246, 253; 428/469, 209, 403; 361/301.1, 301.4; 252/512, 513, 518.1, 521.1

(56) References Cited

U.S. PATENT DOCUMENTS

| | | | | | |
|---|---|---|---|---|---|
| 4,191,557 A | * | 3/1980 | Kondis | ........................ | 75/372 |
| 4,863,510 A | * | 9/1989 | Tamemasa et al. | ............ | 75/351 |
| 5,687,055 A | * | 11/1997 | Miki | .......................... | 361/305 |
| 5,741,347 A | * | 4/1998 | Miki | .......................... | 75/373 |
| 6,051,614 A | * | 4/2000 | Hirai et al. | ................... | 516/20 |
| 6,174,344 B1 | * | 1/2001 | Hayashi et al. | ............... | 75/255 |

FOREIGN PATENT DOCUMENTS

| | | | |
|---|---|---|---|
| JP | 63-5502 | | 1/1988 |
| JP | 10-324906 | | 12/1998 |
| JP | 410324906 A | * | 12/1998 |
| JP | 411021603 A | * | 1/1999 |
| JP | 2000-63901 | | 2/2000 |
| JP | 2000063901 A | * | 2/2000 |
| JP | 2000-87121 | | 3/2000 |
| JP | 2000119709 A | * | 4/2000 |

OTHER PUBLICATIONS

Copy of Japanese Office Action dated May 6, 2003 (and English translation of relevant portion).

* cited by examiner

Primary Examiner—Stephen Stein
(74) Attorney, Agent, or Firm—Dickstein, Shapiro, Morin & Oshinsky, LLP.

(57) ABSTRACT

Provided is a method for manufacturing a metal powder by providing a reducing solution by dispersing caustic alkali, and hydrazine and/or hydrazine hydrate into a solvent; providing a metal salt solution comprising a salt of electroconductive metal, a rare earth metal salt and a solvent; and mixing the reducing solution with the metal salt solution to form a metal powder by depositing a hydroxide derived from the rare earth metal salt and by reducing the salt of electroconductive metal. With this metal powder manufacturing method, the sintering of the metal powder is restricted at a low temperature, the sintering initiation temperature is shifted to a higher level, and rapid sintering shrinkage is restricted, while ceramic grain growth is not accelerated.

6 Claims, 1 Drawing Sheet

METHOD FOR MANUFACTURING A METAL POWDER, A METAL POWDER, AN ELECTROCONDUCTIVE PASTE USING THE SAME, AND A MULTILAYER CERAMIC ELECTRONIC COMPONENT USING THE SAME

RELATED APPLICATION

This is a divisional of U.S. application Ser. No. 09/841,199, now U.S. Pat. No. 6,503,291, filed Apr. 24, 2001.

BACKGROUND OF THE INVENTION

1. Field of the Invention

The present invention relates to a metal powder and a method for manufacturing the same. More particularly, the present invention relates to a method for manufacturing a metal powder for use in an electroconductive paste suitable for forming internal electrodes of a multilayer ceramic electronic component.

2. Description of the Related Art

Conventionally, a multilayer ceramic electronic component, for example, a multilayer ceramic capacitor, comprises a ceramic laminate, internal electrodes and external electrodes. The ceramic laminate is obtained, for example, by baking a raw ceramic laminate formed by laminating a plurality of raw (green) ceramic layers made of a dielectric material. The internal electrodes which are situated between the ceramic layers in the ceramic laminate are formed by providing printing with an electroconductive paste onto a plurality of raw ceramic layers followed by baking together with the raw ceramic laminate. One edge of each of the internal electrodes is exposed to one edge surface of the above-described ceramic layers. The external electrodes are formed by applying an electroconductive paste to the edge surfaces of the ceramic laminate and then baking so as to connect to the edges of the internal electrodes exposed at the edge surfaces of the ceramic laminate.

An electroconductive paste is used for such a multilayer ceramic electronic component, and especially for forming internal electrodes of a multilayer ceramic capacitor. The electroconductive paste contains a metal powder that functions as an electroconductive component. In recent years, a base metal powder such as nickel powder and copper powder has come to be used as the metal powder, in addition to a noble metal powder such as silver and palladium powders previously used. Furthermore, as progress has been made in realizing miniaturization and thickness reduction of the layers of a multilayer ceramic electronic component, finer particles are demanded for the metal powder contained in an electroconductive paste for use in forming such internal electrodes.

As the particle size of a metal powder becomes smaller, the specific surface area of the powder grows in proportion to the second power of the particle size, and as the specific surface area grows, the sintering temperature of the metal powder becomes lower. If internal electrodes of a multilayer ceramic electronic component are formed with an electroconductive paste comprising a metal powder with such a small particle size, sintering of the metal powder proceeds rapidly before sintering of the ceramic powder used to form the ceramic laminate begins, tending to cause structural defects such as delamination, owing to the difference of the shrinkage behaviors between the ceramic powder and the metal powder.

Japanese Unexamined Patent Application Publication 4-45835 discloses a method for causing local hydrolysis with a metal alkoxide on the surface of a metal particle so as to form compact layers of minute metal oxide particles such as titania or silica on the surface. Furthermore, Japanese Unexamined Patent Application Publication 11-45617 discloses a method for coating particles of a base metal such as manganese or manganese oxide. However, if an electroconductive paste comprising such a metal powder is used for forming an electrode film, and the film is baked at the same time with ceramic green sheets, the silica or the like coating the metal powder diffuses into the ceramic and accelerates the grain growth of the ceramic grains, with the result that such growth of ceramic grains may entail problems of interlayer delamination and crack generation.

Furthermore, Japanese Unexamined Patent Application Publication 10-324906 discloses a method for manufacturing a nickel powder by a spray thermal decomposition method in which, for example, composite oxides comprising lanthanum and nickel are deposited on the surface of the nickel powder. It discloses that contact between nickel metal particles can be prevented when internal electrodes are formed with an electroconductive paste comprising such a nickel powder, and therefore the sintering temperature of the nickel powder can be shifted to a higher level, with the result that a ceramic electronic component can be obtained which is prevented from delamination. However, sintering of the nickel according to this method proceeds rapidly once the coating film made of the composite oxides existing on the surface of the nickel powder is destroyed during the baking step, with the result that there appears a problem of rapid stress generation in the internal electrodes which will induce crack generation.

A metal powder gas phase manufacturing method such as the spray thermal decomposition method also has a problem in that it is more expensive and more complex than a liquid phase metal powder manufacturing method.

SUMMARY OF THE INVENTION

Accordingly, it is an object of the present invention to solve the above-described problems, and to provide a metal powder and a manufacturing method therefor wherein sintering of the metal powder is restricted at a low temperature, the sintering initiation temperature is shifted to a higher level, and rapid sintering shrinkage is restricted, while grain growth of a ceramic is not accelerated.

For achieving the above-described object, the metal powder manufacturing method according to the present invention is characterized in that a metal powder is obtained from a mixture comprising a caustic alkali, hydrazine and/or hydrazine hydrate, a salt of electroconductive metal, a rare earth metal salt and a main solvent, by depositing a rare earth metal hydroxide derived from the above-described rare earth metal salt, and by reducing the above-described salt of electroconductive metal.

In particular, the metal powder manufacturing method according to the present invention preferably comprises the steps of: preparing a reducing solution comprising the caustic alkali, the hydrazine and/or hydrazine hydrate and the main solvent; preparing a metal salt solution comprising the salt of electroconductive metal, the rare earth metal salt and the main solvent; and mixing the reducing solution with the metal salt solution to form a metal powder by depositing a hydroxide derived from the rare earth metal salt and by reducing the salt of electroconductive metal.

The present invention is characterized in that the reduction reaction of a salt of electroconductive metal and the deposition reaction of a rare earth metal hydroxide are performed simultaneously in one reaction step so that a metal powder is recovered in which the metal obtained by the reduction of the salt of electroconductive metal and the deposited rare earth metal hydroxide exist in an intermingled state. Such a metal powder is different from a metal powder in which minute metal oxide particles or the like coat only the surface of the metal in that a rare earth metal hydroxide is intermingled with the metal powder, with the result that not only are the metal particles formed by reducing the salt of electroconductive metal are prevented from contacting with each other but also undesirable migration of the metal particles can be prevented. Accordingly, rapid sintering of the metal powder can be prevented at the time of baking an electroconductive paste comprising this metal powder.

It is noted that the state in which a rare earth metal hydroxide is intermingled with a metal powder is a state in which minute rare earth metal hydroxide particles exist on the surface of as well as inside the metal powder thus obtained.

DESCRIPTION OF THE PREFERRED EMBODIMENTS

Figure 1:
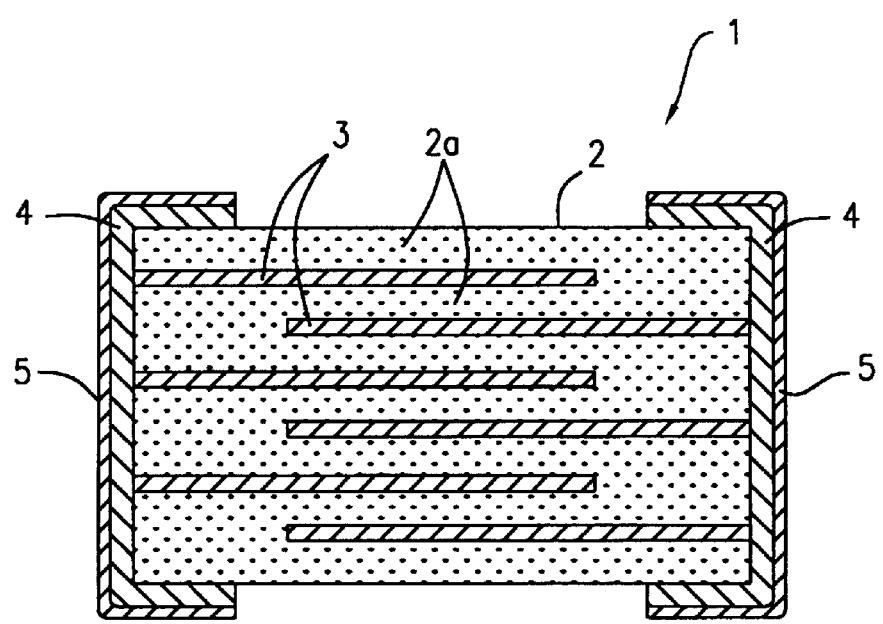
FIG. 1 is a cross-sectional view of a multilayer ceramic electronic component according to an embodiment of the present invention.

In the present invention, the amount of the rare earth metal salt used, when converted to the amount of the rare earth metal, is preferably not less than about 0.1% by weight based on 100% by weight of the salt of electroconductive metal when converted to the amount of the metal. When the amount is less than about 0.1% by weight, the above-described effect is hard to obtained.

Furthermore, the salt of electroconductive metal for use in the present invention can be reduced by hydrazine, and the metal can be deposited as a single metal or as an alloy by the reduction reaction. Furthermore, the metal thus reduced is required to show electroconductivity.

Such a salt of electroconductive metal is preferably a metal salt comprising at least one of palladium, and copper and nickel, which are common base metals as electroconductive materials for an electroconductive paste for forming electrodes of an electronic component. However, there is no specific limitation of the salt of electroconductive metal. It is preferably well soluble in the chosen main solvent, and, therefore, it is preferably a chloride, sulfate or nitrate.

Furthermore, the rare earth metal for use in the present invention is required to be able to exist as a hydroxide in the presence of a caustic alkali. By virtue of this rare earth metal hydroxide existing in the metal powder, the sintering behavior of the metal powder is improved. Although there is no specific limitation of the rare earth metal salt, it is preferable that the salt is well soluble in the chosen main solvent, and, therefore, it is preferably a chloride, sulfate or nitrate. As the rare earth metal, it is preferable to use at least one selected from the group consisting of lanthanum, cerium, neodymium, samarium, europium, gadolinium, terbium, dysprosium and ytterbium.

Furthermore, it is preferable that the caustic alkali for use in the present invention be at least one selected from the group consisting of potassium hydroxide, sodium hydroxide, calcium hydroxide, barium hydroxide and ammonia. When hydrazine is used in reducing a metal salt, it is necessary to supply a hydroxide ion. In the metal powder manufacturing method according to the present invention, the caustic alkali acts as a source for supplying a hydroxide ion. It also has the function of depositing the rare earth metal salt as a hydroxide. It is most preferable to use sodium hydroxide as the only caustic alkali.

The main solvent for use in the present invention is preferably a mixed solvent of an alcohol and water. The alcohol is preferably at least one monohydric alcohol such as methanol, ethanol and propanol. Through reduction to a metal by selecting hydrazine as a reducing agent and an alcohol as a main solvent, a metal powder having a particle size of not more than about 100 nm can be obtained, and a ceramic electronic component having thinner layers of internal electrodes can be realized by using an electroconductive paste comprising such minute metal particles. It is noted that by selecting a solvent comprising an alcohol as a main solvent, the solubility of an metal ion can be lowered in comparison with a case in which only water is used as a solvent, with the result that the deposition rate of the metal can be raised and the particle size of the deposited metal powder can be reduced. Accordingly, it is possible to control the particle size of a deposited metal powder by changing the concentration of the alcohol in the main solvent.

Preferable embodiments of the metal powder manufacturing method according to the present invention are described below.

First, a caustic alkali is dissolved into a main solvent at a molar concentration of from about 0.5 to 5.0 mol/L, using ethanol as the only main solvent and sodium hydroxide as the only caustic alkali. Furthermore, hydrazine or hydrazine hydrate is dissolved into the solution so as to form a reducing solution in an amount ranging up to about 15 times the amount which is stoichiometrically necessary for reducing the salt of electroconductive metal to be used.

Next, a chloride of electroconductive metal comprising at least one selected from the group consisting of palladium, copper and nickel, in an amount of from about 0.01 to 1 mol/L, and a rare earth metal chloride comprising at least one selected from the group consisting of lanthanum, cerium, neodymium, samarium, europium, gadolinium, terbium, dysprosium and ytterbium, are dissolved into the main solvent to form a metal salt solution. In a more specifically preferred embodiment, the amount of the rare earth metal salt to be added, when converted to the amount of the metal, is not more than about 30% by weight based on 100% by weight of the salt of electroconductive metal to be added when converted to the amount of the metal. When the amount of the rare earth metal salt is not more than about 30% by weight, the above-described effect is fully achieved, and yet the equivalent series resistance of a ceramic electronic component having internal electrodes formed with such an electroconductive paste can be restricted low.

Next, the above-described reducing solution and the metal salt solution are mixed together. Here, it is preferable that the temperatures of both solutions as well as that of the mixed solution be in the range of from about 20 to 60° C. When the temperature of the mixed solution, that is, reaction temperature exceeds about 20° C., the reduction reaction proceeds easily. When the temperature of the mixed solution does not exceed about 60° C., the concentration of the mixed solution remains relatively constant since ethanol or the main solvent does not evaporate. The reduction reaction proceeds in a high pH alkaline region. Since typically the pH of the reducing solution is about 13 and the pH of the metal salt solution is about 5, it is possible to make the reaction proceed while maintaining a high pH state if the metal salt solution is added into the reducing solution dropwise. Therefore, it is preferable as a procedure for the mixing to add the metal salt solution dropwise into the reducing solution under agitation, although it is not necessarily a limiting condition.

The metal which has been deposited by the reduction of the metal salt is separated, recovered, washed with water, acetone or the like, and dried to provide a metal powder.

The metal powder thus obtained is in a state in which the metal powder is intermingled with a rare earth metal hydroxide, or more particularly, minute rare earth metal hydroxide particles having an average particle size of from several nm to several tens of nm exist on the surface of and inside the metal particles having an average particle size on the order of from about 40 nm to 100 nm. Accordingly, not only mutual contact between the metal particles but also undesirable migration of the metal particles can be prevented, and therefore rapid sintering of the metal powder can be prevented at the time of baking an electroconductive paste comprising this metal powder, owing to the rare earth metal hydroxide existing both on the surface and on the inside. The rare earth metal hydroxide is preferably adsorbed on the whole surface area of the metal powder.

The electroconductive paste according to the present invention comprises a metal powder according to the above-described present invention and a pasty carrier which is conventionally the combination of an organic vehicle and a solvent. Although there is no specific limitation to the type and the content of the organic vehicle and the solvent, a preferred paste is obtained, for example, by adding 40% by weight of an organic vehicle prepared by dissolving 10 parts by weight of an ethylcellulose type resin as an organic binder into 90 parts by weight of terpineol as a solvent and 50% by weight of a metal powder according to the above-described present invention, to 10% by weight of terpineol, followed by a dispersing and blending treatment with a three-roll mill.

One embodiment of a ceramic electronic component according to the present invention will be described in detail based on FIG. 1. Accordingly, a ceramic electronic component 1 is, for example, composed of a ceramic laminate 2, internal electrodes 3, external electrodes 4 and plating films 5.

The ceramic laminate 2 is formed by baking a raw ceramic laminate obtained by laminating a plurality of ceramic layers 2a prepared from a dielectric material comprising $BaTiO_3$ as a main component.

The internal electrodes 3 are located between the ceramic layers 2a inside the ceramic laminate 2. They are formed by providing printing with an electroconductive paste onto the plurality of raw ceramic layers 2a, followed by baking a raw ceramic laminate which was formed by laminating a plurality of the raw ceramic layers having the paste layers thereon. One edge of each of the internal electrodes 3 is formed so as to be exposed to one of two opposing edge surfaces of the ceramic layers 2.

The external electrodes 4 are formed by applying an electroconductive paste to the edge surfaces of the ceramic laminate 2 and baking so as to be connected electrically and mechanically to either of the edges of internal electrodes 3 exposed on the edge surfaces of the ceramic laminate 2.

The plating films 5 are composed, for example, of an electroless plating of Sn, Ni or the like, a solder plating, or other platings. They are composed of at least one layer respectively on the external electrodes 4.

The material for a ceramic laminate 2 of a ceramic electronic component according to the present invention is not limited to the above-described embodiments. It may be formed, for example, of a different dielectric material such as $PbZrO_3$, an insulating material, a magnetic material or a semiconductor material. Furthermore, the number of the layers of internal electrodes of a multilayer ceramic electronic component according to the present invention is not limited to the number shown in the above-described embodiments. There is no limitation to the number of the layers, and there may also be a case in which a multilayer ceramic electronic component has no internal electrodes, i.e., the fine powdered metal is used in the external electrode(s). Furthermore, the plating films 5 are not necessarily required. There is also no limitation to the number of the layers of the plating films 5.

EXAMPLES

Concrete examples of the present invention will be described below. However, the present invention is not limited by the examples below.

Example 1

First, 2 g of sodium hydroxide and 5 g of hydrazine hydrate were dissolved into 100 mL of ethanol to form a reducing solution.

Next, nickel chloride and lanthanum chloride were mixed together at the blending ratios described in the following Table 1. They were dissolved into 100 mL of ethanol to form the metal salt solutions of Samples 1 to 8. Only nickel chloride was dissolved into 100 mL of ethanol in the same way to form the metal salt solutions of Samples 9 and 10.

Next, the metal salt solutions of Samples 1 to 10 were added to the reducing solution dropwise with agitation of the reducing solution to form a series of mixed solutions, while keeping the reducing solution and the sample metal salt solutions at 60° C., so that the nickel chloride was reduced to form a nickel powder in the mixed solutions.

Next, the nickel powders in the mixed solutions were separated, recovered, washed with pure water and then with acetone, followed by drying in an oven to form nickel powders. These nickel powders were approximately spherical with a particle size of from 40 to 60 nm under observation with a scanning electron microscope. From an X-ray diffraction measurement, the spectra of Ni and $La(OH)_3$ were found in the nickel powders obtained from the metal salt solutions of Samples 1 to 7, and a spectrum of Ni was found in the nickel powders obtained from the metal salt solutions of Samples 8 to 10.

Next, the nickel powder obtained from the Sample 10 metal salt solution was subjected to a surface treatment with silica. Accordingly, it was treated according to the same method as described in Example 8 of Japanese Unexamined Patent Application Publication 4-45835. Specifically, the nickel powder with water adsorbed on the surface was dispersed by ultrasonic waves into an organic solvent prepared by adding silicon ethoxide, isopropyl amine and isopropanol into hexane. It was then subjected to reaction at 25° C. for 48 hours under agitation with a stirrer. The reaction product was washed with hexane, methyl alcohol or the like, dried, and then was subjected to a heat treatment at 450° C. to obtain a nickel powder, the surface of which was coated with ultrafine silica particles.

Next, the electroconductive paste Samples A to J were prepared by adding 40% by weight of an organic vehicle formed by dissolving 10 parts by weight of an ethylcellulose type resin as an organic binder into 90 parts by weight of terpineol as a solvent and 50% by weight of the nickel powders obtained from the metal salt solutions of Samples 1 to 10, to 10% by weight of terpineol, followed by a dispersing and blending treatment with a three-roll mill.

sintering behaviors (the initiation and termination temperatures of sintering shrinkage) were also investigated by thermomechanical analysis (TMA). The results are summarized in the following Table 1.

TABLE 1

| Sample | Nickel chloride | | Lanthanum chloride | | Silicon (g) | Lanthanum content ratio (%) | Sintering shrinkage (° C.) | | |
|---|---|---|---|---|---|---|---|---|---|
| | Nickel | (g) | Lanthanum | (g) | | | Initiation temperature | Termination temperature | Temperature difference |
| 1 | 1.2 | 5.0 | 1.5 | 4.0 | — | 56 | 501 | 980 | 479 |
| 2 | 1.2 | 5.0 | 0.75 | 2.0 | — | 38 | 453 | 958 | 505 |
| 3 | 1.2 | 5.0 | 0.375 | 1.0 | — | 23 | 420 | 932 | 512 |
| 4 | 1.2 | 5.0 | 0.15 | 0.4 | — | 11.1 | 402 | 911 | 509 |
| 5 | 1.2 | 5.0 | 0.015 | 0.04 | — | 1.2 | 356 | 825 | 469 |
| 6 | 1.2 | 5.0 | 0.0075 | 0.02 | — | 0.62 | 276 | 701 | 425 |
| 7 | 1.2 | 5.0 | 0.0015 | 0.004 | — | 0.12 | 252 | 680 | 428 |
| 8 | 1.2 | 5.0 | 0.00075 | 0.002 | — | 0.062 | 225 | 455 | 230 |
| 9 | 1.2 | 5.0 | — | — | — | — | 221 | 452 | 231 |
| 10 | 1.2 | 5.0 | — | — | 0.012 | — | 325 | 778 | 453 |

Next, barium titanate ($BaTiO_3$) powder manufactured by a hydrolysis method and having an average particle size ($D_{50}$) of 0.5 μm was prepared as a ceramic powder.

Next, an additive (sintering adjuvant) comprising 0.02 mol % of Dy, 0.02 mol % of Mg, 0.02 mol % of Mn and 3 mol % of Si in a state of oxide powders or carbonate powders is added to the barium titanate powder for mixing. A polyvinylbutyral type binder and an organic solvent such as ethanol were further added to the mixture, followed by wet blending with a ball mill. A ceramic slurry was thus prepared.

Next, ceramic green sheets with a thickness of 1.4 μm were formed using the ceramic slurry by adjusting the slit breadth of the doctor blade according to a doctor blade method.

The ceramic green sheets thus obtained were subjected to printing with the electroconductive paste Samples A to J to form internal electrode patterns. Specifically, a plurality of ceramic green sheets having electrode films with a thickness after drying of 0.6 μm were obtained by applying screen printing to the surfaces of a specific number of ceramic green sheets so that one edge of each internal electrode pattern was exposed at one of the opposing edge surfaces of the ceramic laminate which were to be ultimately obtained, and the other edge stayed inside the ceramic laminate, and by changing the thickness of the screen patterns.

Next, a plurality of ceramic green sheets each with internal electrode patterns formed with the electroconductive paste Samples A to J were laminated, were unified by thermal pressing, and were then cut to a specific size to provide raw ceramic laminates.

Next, they were heated in an $N_2$ atmosphere at 400° C. to burn off the organic binder, and were held in a reducing atmosphere of $H_2$—$N_2$—$H_2O$ gas at an oxygen partial pressure of $9 \times 10^{-12}$ MPa and in a temperature range up to a maximum baking temperature of 1,200° C. for three hours so as to form a ceramic laminate. The ceramic laminate after baking had 250 dielectric ceramic layers, and the internal electrode area per ceramic layer was $17.8 \times 10^{-6}$ $m^2$.

The nickel powders obtained from the metal salt solutions of Samples 1 to 10 were subjected to inductively coupled plasma-atomic emission spectrometry (ICP-AES) for measuring composition for nickel, lanthanum and silicon. Their Regarding the ceramic laminates comprising internal electrodes formed with the electroconductive paste Samples A to J, the delamination occurrence rates between the ceramic layers, the coverages (the coated area rates of the internal electrodes), the crack occurrence rates, the average grain sizes of the ceramic grains, and the ESRs (equivalent serial resistances) were measured. The results are summarized in the following Table 2.

The delamination occurrence rates were determined as follows: a ceramic laminate was cut along the surface in the direction perpendicular to the lengthwise direction; surfaces thus cut were polished and were subjected to microscopic observation with the naked eye to count the number of samples in which interlayer delamination was observed. The number of samples in which interlayer delaminating was generated out of 100 samples was determined as the rate.

Regarding coverage, surfaces of internal electrodes of ceramic laminates were peeled away, pictures of the surfaces of the internal electrodes having pores were taken through a microscope, and they were subjected to a picture analysis as a quantitative analysis.

The crack occurrence rates were determined as follows: a ceramic laminate embedded in a resin was cut along the surface in the direction perpendicular to the lengthwise direction; surfaces thus cut were polished and were subjected to microscopic observation with the naked eye to counting the number of samples in which cracks appeared inside the internal electrodes. The number of samples in which cracks were generated out of 100 samples was determined as the rate.

The average grain sizes of the ceramic grains were determined as follows: a ceramic laminate was cut along the cross-section in the direction perpendicular to the lengthwise direction; surfaces thus cut were polished and were subjected to a chemical etching treatment; and they were subjected to observation under a scanning electron microscope for determining the size.

Regarding the ESRs, an electroconductive thick film paste having Ag as an electroconductive component was applied to both edge surfaces of the ceramic laminates at which the internal electrodes were exposed, followed by baking to form external electrodes. The ESRs were measured on these electrodes.

TABLE 2

| Sample | Delamination occurrence rate (%) | Coverage (%) | Crack occurrence rate (%) | Average grain size (μm) | ESR (W) |
|---|---|---|---|---|---|
| A | 1 | 0 | 60 | 0 | 0.5 | 524 |
| B | 2 | 0 | 75 | 0 | 0.5 | 495 |
| C | 3 | 0 | 88 | 0 | 0.5 | 142 |
| D | 4 | 0 | 92 | 0 | 0.5 | 137 |
| E | 5 | 0 | 89 | 0 | 0.5 | 125 |
| F | 6 | 0 | 85 | 0 | 0.5 | 118 |
| G | 7 | 0 | 82 | 0 | 0.5 | 111 |
| H | 8 | 55 | 65 | 100 | 0.5 | 107 |
| I | 9 | 58 | 67 | 100 | 0.5 | 103 |
| J | 10 | 75 | 85 | 60 | 3.8 | 107 |

As is evident from Table 1, it was found that the nickel powders (Samples 1 to 8) formed by adding lanthanum chloride to metal salt solutions followed by reduction, had initiation and termination temperatures of sintering shrinkage which were shifted to higher levels in comparison with the nickel powders (Samples 9 and 10) formed by reduction without adding lanthanum chloride. Furthermore, the temperature differences between the initiation temperatures and the termination temperatures of sintering shrinkage became larger approximately in proportion to the amount of added lanthanum chloride, indicating that sintering of nickel powders proceeds more gently as the amount of lanthanum chloride is increased.

Furthermore, the nickel powder (Sample 10) the surface of which was coated with ultrafine silica particles without addition of lanthanum chloride showed a shrinkage behavior wherein it had initiation and termination temperatures of sintering shrinkage approximately in the middle of those of the Sample 5 nickel powder and Sample 6 nickel powder.

As is evident from Table 2, with the ceramic laminates formed using the electroconductive paste Samples C to G having nickel powders (Samples 3 to 7) which comprised 0.12 to 23% by weight of lanthanum, the delamination occurrence rates were all 0%, the coverages were in the range of from 82 to 92%, and the crack occurrence rates were all 0%.

With the ceramic laminates having internal electrodes formed with the electroconductive paste Samples A and B which comprised nickel powders (Samples 1 and 2) having more than about 30% by weight, or, to be more specific, 38% by weight or 56% by weight of lanthanum in 100% by weight of a nickel powder, the ESRs tended to show rather high values of from 495 to 524 Ω but the occurrence rates of delamination and cracks were both 0%.

In contrast, with the ceramic laminates formed with the electroconductive paste Samples H to J which comprised nickel powders (Samples 8 to 10) on which less than about 0.1% by weight of lanthanum was deposited, or, more specifically, only 0.062% by weight of lanthanum was deposited or no lanthanum was deposited at all, the delamination occurrence rates were as high as 55 to 75% and the crack occurrence rates were as high as 60 to 100%.

The ceramic laminate manufactured using the electroconductive paste Sample J comprising the nickel powder (Sample 10) whose surface was coated with ultrafine silica particles had a large average grain size of 3.8 μm. This is considered to have been caused by diffusion of the silica coating on the nickel powder into the ceramic layers at the time of baking the raw ceramic laminate, which resulted in unusual ceramic grain growth. It is supposed that such unusual ceramic grain growth causes interlayer delamination and crack generation at the time of or after baking of a ceramic laminate.

Furthermore, as is evident from Table 1 and 2, all of the nickel powders obtained from the metal salt solutions of Samples 3 to 7 had temperature differences between the initiation temperatures and the termination temperatures of sintering shrinkage of not less than 300° C., and initiation temperatures of sintering shrinkage of not more than 420° C. It is understood that when the above-described temperature difference is less than 300° C., sintering of a nickel powder proceeds rapidly, with the result that cracks tend to be generated easily in a ceramic laminate.

Example 2

First, 2 g of sodium hydroxide and 5 g of hydrazine hydrate were dissolved into 100 mL of ethanol to form a reducing solution in the same way as in Example 1.

Next, copper nitrate and samarium chloride were mixed together at blending ratios described in the following Table 3. They were dissolved into 100 mL of methanol to form the metal salt solutions of Samples 11 to 18. Only copper nitrate was dissolved into 100 mL of ion exchange water in the same way to form the metal salt solutions of Samples 19 and 20.

Next, the metal salt solutions of Samples 11 to 20 were added to the reducing solution dropwise with agitation of the reducing solution to form mixed solutions respectively, while keeping the reducing solution and the metal salt solutions of Samples 11 to 20 at 50° C., so that the copper nitrate was reduced to form copper powder in each mixed solution.

Next, the copper powder in the mixed solutions were separated, recovered, washed with pure water and then with acetone, followed by drying at room temperature to form copper powders. These copper powders were approximately spherical with a particle size of from 70 to 90 nm in observation under a scanning electron microscope. From an X-ray diffraction measurement, spectra of Cu and Sm(OH)$_3$ were found in the copper powders obtained from the metal salt solutions of Samples 11 to 17, and a spectrum of Cu was found in the copper powders obtained from the metal salt solutions of Samples 18 to 20.

Next, the copper powder obtained from Sample 20 metal salt solution was subjected to a surface treatment with manganese. Accordingly, it was treated according to the same method as described in the Example of Japanese Unexamined Patent Application Publication 11-45617. Specifically, a copper powder with an average particle size of 80 nm wherein the particle surface had been subjected to an activation treatment was put into a strongly acidic solution comprising manganese sulfate to form a reaction product by controlling the manganese ion concentration while maintaining the pH at 3. The product was then subjected to a heat treatment in an oxygen atmosphere to obtain a copper powder the surface of which was coated with ultrafine manganese particles.

Next, the electroconductive paste Samples K to T were prepared by adding 40% by weight of an organic vehicle formed by dissolving 10 parts by weight of an ethylcellulose type resin as an organic binder into 90 parts by weight of terpineol as a solvent and 50% by weight of the copper powders obtained from the metal salt solutions of Samples 11 to 20, to 10% by weight of terpineol, followed by a dispersing and blending treatment with a three-roll mill.

Next, ceramic green sheets with a thickness of 1.4 μm were formed in the same way as in Example 1. These ceramic green sheets were subjected to printing with the electroconductive paste Samples K to T to form internal electrode patterns. Specifically, a plurality of ceramic green sheets having electrode films with a thickness after drying of 0.6 μm were obtained by applying screen printing to the surfaces of a specific number of ceramic green sheets so that one edge of each internal electrode pattern was exposed to one of the opposing edge surfaces of the ceramic laminate which were to be ultimately obtained, and the other edge stayed inside the ceramic laminate, and by changing the thickness of the screen patterns.

Next, a plurality of ceramic green sheets each with internal electrode patterns formed with the electroconductive paste Samples K to T thereon were laminated, were unified by thermal pressing, and were then cut to a specific size to provide raw ceramic laminates.

Next, they were heated in an $N_2$ atmosphere at 250° C. to burn off the organic binder, and were held in a reducing atmosphere of $H_2$—$N_2$—$H_2O$ gas at an oxygen partial pressure of $9\times10^{-12}$ MPa and in a temperature range up to a maximum baking temperature of 1,100° C. for two hours so as to form ceramic laminates. Each ceramic laminates after baking had 100 dielectric ceramic layers and the internal electrode area per ceramic layer was $15.8\times10^{-6}$ $m^2$.

The copper powders obtained from the metal salt solutions of Samples 11 to 20 were subjected to inductively coupled plasma-atomic emission spectrometry (ICP-AES) for measuring composition for copper, samarium and manganese. Their sintering behaviors (the initiation and termination temperatures of sintering shrinkage) were also investigated applying a thermomechanical analysis (TMA). The results are summarized in the following Table 3.

TABLE 4

| Sample | Delamination occurrence rate (%) | Coverage (%) | Crack occurrence rate (%) | Average grain size (μm) | ESR (W) |
|---|---|---|---|---|---|
| K | 11 | 0 | 56 | 0 | 0.5 | 562 |
| L | 12 | 0 | 72 | 0 | 0.5 | 513 |
| M | 13 | 0 | 85 | 0 | 0.5 | 139 |
| N | 14 | 0 | 91 | 0 | 0.5 | 132 |
| O | 15 | 0 | 88 | 0 | 0.5 | 124 |
| P | 16 | 0 | 83 | 0 | 0.5 | 118 |
| Q | 17 | 0 | 80 | 0 | 0.5 | 112 |
| R | 18 | 91 | 53 | 100 | 0.5 | 108 |
| S | 19 | 93 | 55 | 100 | 0.5 | 103 |
| T | 20 | 83 | 78 | 87 | 2.7 | 109 |

As is evident from Table 3, it was found that the copper powders (Samples 11 to 18) formed by adding samarium chloride to metal salt solutions followed by reduction, had initiation and termination temperatures of sintering shrinkage which were shifted to higher levels in comparison with the copper powder (Sample 19) formed by reduction without adding samarium chloride. Furthermore, the temperature differences between the initiation temperatures and the termination temperatures of sintering shrinkage became larger approximately in proportion to the amount of added samarium chloride, indicating that sintering of copper powders proceeds more gently as the amount of added samarium chloride is increased.

Furthermore, the copper powder (Sample 20) the surface of which was coated with ultrafine manganese particles without addition of samarium chloride had an initiation temperature of sintering shrinkage which was situated between those of the Sample 16 copper powder and Sample

TABLE 3

| Sample | Copper nitrate Copper | (g) | Samarium chloride Samarium | (g) | Manganese (g) | Samarium content ratio (%) | Sintering shrinkage (° C.) Initiation temperature | Termination temperature | Temperature difference |
|---|---|---|---|---|---|---|---|---|---|
| 11 | 2.6 | 10.0 | 4.1 | 10.0 | — | 61 | 450 | 793 | 343 |
| 12 | 2.6 | 10.0 | 1.23 | 3.0 | — | 31 | 426 | 763 | 337 |
| 13 | 2.6 | 10.0 | 0.82 | 2.0 | — | 24 | 398 | 735 | 337 |
| 14 | 2.6 | 10.0 | 0.41 | 1.0 | — | 13.6 | 367 | 715 | 348 |
| 15 | 2.6 | 10.0 | 0.041 | 0.1 | — | 1.6 | 311 | 628 | 317 |
| 16 | 2.6 | 10.0 | 0.021 | 0.05 | — | 0.80 | 280 | 583 | 303 |
| 17 | 2.6 | 10.0 | 0.0041 | 0.01 | — | 0.16 | 221 | 522 | 301 |
| 18 | 2.6 | 10.0 | 0.00210 | 0.005 | — | 0.081 | 194 | 409 | 215 |
| 19 | 2.6 | 10.0 | — | — | — | — | 195 | 412 | 217 |
| 20 | 2.6 | 10.0 | — | — | 0.030 | — | 235 | 498 | 263 |

Regarding the ceramic laminates comprising internal electrodes formed with the electroconductive paste Samples K to T, the delamination occurrence rates between the ceramic layers, the coverages (the coated area rates of the internal electrodes), the crack occurrence rates, the average grain sizes of the ceramic grains, and the ESRs (equivalent serial resistances) were measured. The results are summarized in the following Table 4.

The delamination occurrence rates, the coverages, the crack occurrence rates, the average grain sizes, and the ESR's were measured in the same way as in Example 1.

17 copper powder, while it had a termination temperature of sintering shrinkage which was situated approximately in the middle of those of the Sample 17 copper powder and Sample 18 copper powder. From this, it is understood that if a copper powder formed by reduction through addition of samarium chloride into a metal salt solution has the same initiation temperature of sintering shrinkage as that of Sample 20 copper powder, the temperature difference between the initiation temperature and the termination temperature of sintering shrinkage of Sample 20 copper powder becomes smaller, since its termination temperature of sintering shrinkage is lower, with the result that the sintering proceeds more rapidly than those of the copper powders of Samples 11 to 18.

Furthermore, as is evident from Table 4, with the ceramic laminates formed using the electroconductive paste Samples M to Q which comprised copper powders on which 0.16 to 24% by weight of samarium was deposited, the delamination occurrence rates were all 0%, the coverages were in the range of from 80 to 91% and the crack occurrence rates were all 0%.

Furthermore, with the ceramic laminates having internal electrodes formed with the electroconductive paste Samples K and L which comprised copper powders (Samples 11 and 12) having more than about 30% by weight, or, to be more specific, 31% by weight or 61% by weight of samarium deposited in 100% by weight of the copper powder, the ESRs tended to show rather high values of from 513 to 562 Ω, but the occurrence rates of delamination and cracks were both 0%.

In contrast, with the ceramic laminates formed with the electroconductive paste Samples R to T which comprised copper powders (Samples 18 to 20) on which less than about 0.1% by weight of samarium was deposited, or, to be more specific, only 0.081% by weight of samarium was deposited or no samarium was deposited at all, the delamination occurrence rates were as high as 83 to 93% and the crack occurrence rates were as high as 87 to 100%.

The ceramic laminate formed with the electroconductive paste Sample T comprising the copper powder (Sample 20), the surface of which was coated with ultrafine manganese particles, had a large average grain size of 2.7 μm. This is considered to have been caused by diffusion of the manganese coating on the copper powder into the ceramic layers at the time of baking the raw ceramic laminate, which resulted in unusual ceramic grain growth. Such unusual ceramic grain growth causes interlayer delamination and crack generation at the time of or after baking of a ceramic laminate.

Furthermore, as is evident from Tables 3 and 4, all of the copper powders obtained from the metal salt solutions of Samples 13 to 17 had temperature differences between the initiation temperatures and the termination temperatures of sintering shrinkage of not less than 300° C., and initiation temperatures of sintering shrinkage of not more than 420° C. It is understood that when the above-described temperature difference is lower than 300° C., sintering of a copper powder proceeds rapidly, with the result that cracks tend to be generated easily in the ceramic laminates.

As described above, according to the metal powder manufacturing method of the present invention, it is possible to provide a metal powder wherein sintering of the metal powder is restricted at a low temperature, the sintering initiation temperature is shifted to a higher temperature, and rapid sintering shrinkage is restricted, while ceramic grain growth is not accelerated. Furthermore, it is possible to supply an electroconductive paste providing such unique effects as well as a multilayer ceramic electronic component equipped with internal electrodes having such effects.

What is claimed is:

1. An electroconductive paste comprising a metal powder comprising an electroconductive metal having rare earth metal hydroxide on the surface of and in the inside thereof, and a vehicle.

2. An electroconductive paste according to claim 1, wherein said rare earth metal hydroxide is adsorbed on substantially the whole surface of said electroconductive metal powder.

3. An electroconductive paste according to claim 1, wherein said electroconductive metal is at least one member selected from the group consisting of palladium, copper and nickel.

4. An electroconductive paste according to claim 3, wherein the average particle size is about 40 to 100 nm.

5. A multilayer ceramic electronic component, comprising:
    a ceramic laminate having edge surfaces and comprising a plurality of ceramic layers;
    a plurality of internal electrodes, each of which is disposed between a pair of said ceramic layers such that one edge of the electrode is exposed at one edge surface of said laminate; and
    an external electrode electrically connected to an exposed edge of an internal electrode,
    wherein said internal electrodes comprise a metal powder comprising an electroconductive metal having rare earth metal hydroxide on the surface of and in the inside thereof.

6. A multilayer ceramic electronic component according to claim 5, wherein said multilayer ceramic electronic component is a multilayer ceramic capacitor.

* * * * *